US011326443B2

(12) United States Patent
Watanabe et al.

(10) Patent No.: US 11,326,443 B2
(45) Date of Patent: May 10, 2022

(54) METHOD AND SYSTEM FOR GENERATING A COMPLETION DESIGN USING A STREAMLINE MODEL

(71) Applicant: Schlumberger Technology Corporation, Sugar Land, TX (US)

(72) Inventors: Shingo Watanabe, Houston, TX (US); Frode Bratvedt, Asker (NO); Matthew Worthington, Houston, TX (US); Vadim Blekhman, St. Bellaire, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 279 days.

(21) Appl. No.: 16/497,789

(22) PCT Filed: Apr. 30, 2018

(86) PCT No.: PCT/US2018/030076
§ 371 (c)(1),
(2) Date: Sep. 25, 2019

(87) PCT Pub. No.: WO2018/201117
PCT Pub. Date: Nov. 1, 2018

(65) Prior Publication Data
US 2020/0102819 A1 Apr. 2, 2020

Related U.S. Application Data

(60) Provisional application No. 62/492,069, filed on Apr. 28, 2017.

(51) Int. Cl.
*E21B 47/098* (2012.01)
*G01V 1/48* (2006.01)
(Continued)

(52) U.S. Cl.
CPC .......... *E21B 47/098* (2020.05); *E21B 47/107* (2020.05); *G01V 1/48* (2013.01); *G01V 99/005* (2013.01); *G01V 2210/41* (2013.01)

(58) Field of Classification Search
CPC ...... E21B 47/098; E21B 47/107; E21B 43/00; E21B 2200/20; G01V 1/48; G01V 99/005; G01V 2210/41; G06F 30/20
See application file for complete search history.

(56) References Cited

U.S. PATENT DOCUMENTS

2003/0056952 A1* 3/2003 Stegemeier ............. E21B 47/11
166/250.12
2004/0015295 A1* 1/2004 Bratvedt ................. E21B 49/00
702/13
(Continued)

FOREIGN PATENT DOCUMENTS

WO 2008/002345 A2 1/2008
WO WO-2009032416 A1 * 3/2009 ............. E21B 43/00
(Continued)

OTHER PUBLICATIONS

International Preliminary Report on Patentability for the equivalent International patent application PCT/US2018/030076 dated Nov. 7, 2019.
(Continued)

*Primary Examiner* — Yoshihisa Ishizuka

(57) ABSTRACT

Reservoir sweep efficiency includes obtaining fluid front arrival times for streamlines in a reservoir. A wellbore is partitioned into independent production zones, and a target flow rate is allocated to each of the independent production zones based on the fluid front arrival times. Partition choke parameters complying with the target flow rates are allocated to generate a completion design, which is presented.

23 Claims, 8 Drawing Sheets

(51) Int. Cl.
*G01V 99/00* (2009.01)
*E21B 47/107* (2012.01)

(56) References Cited

U.S. PATENT DOCUMENTS

| | | | |
|---|---|---|---|
| 2010/0161292 A1* | 6/2010 | Shook | E21B 49/00 703/2 |
| 2011/0290479 A1* | 12/2011 | Izgec | E21B 43/16 166/250.02 |
| 2013/0021874 A1* | 1/2013 | Hartog | E21B 47/107 367/31 |
| 2014/0214386 A1 | 7/2014 | Gehin | |
| 2016/0098155 A1* | 4/2016 | Johnston | E21B 41/00 715/770 |
| 2016/0123112 A1* | 5/2016 | Purkis | E21B 34/14 166/320 |
| 2016/0131801 A1* | 5/2016 | Singh | G01V 99/005 702/6 |

FOREIGN PATENT DOCUMENTS

| | | | | |
|---|---|---|---|---|
| WO | 2013/052725 A1 | 4/2013 | | |
| WO | WO-2013045941 A1 * | 4/2013 | | E21B 47/10 |
| WO | WO-2015103573 A1 * | 7/2015 | | E21B 43/00 |
| WO | WO-2015103582 A1 * | 7/2015 | | E21B 43/267 |
| WO | 2016/176522 A1 | 11/2016 | | |
| WO | 2017/027068 A1 | 2/2017 | | |
| WO | WO-2017065813 A1 * | 4/2017 | | E21B 43/00 |

OTHER PUBLICATIONS

Extended European Search Report dated Dec. 11, 2020 in counterpart European Patent Application No. 18790728.2.
International Search Report and Written Opinion for the equivalent International patent application PCT/US2018/030076 dated Jul6 17, 2018.

* cited by examiner

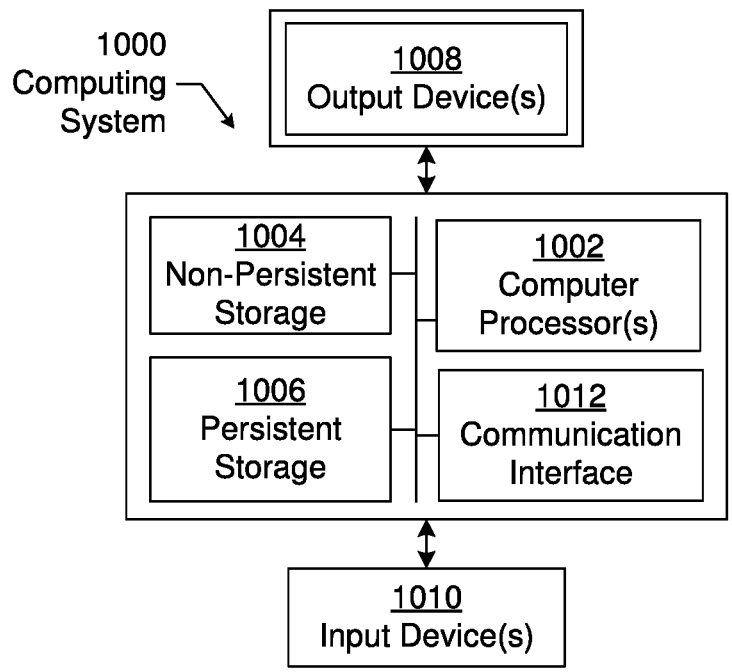
*FIG. 10.1*
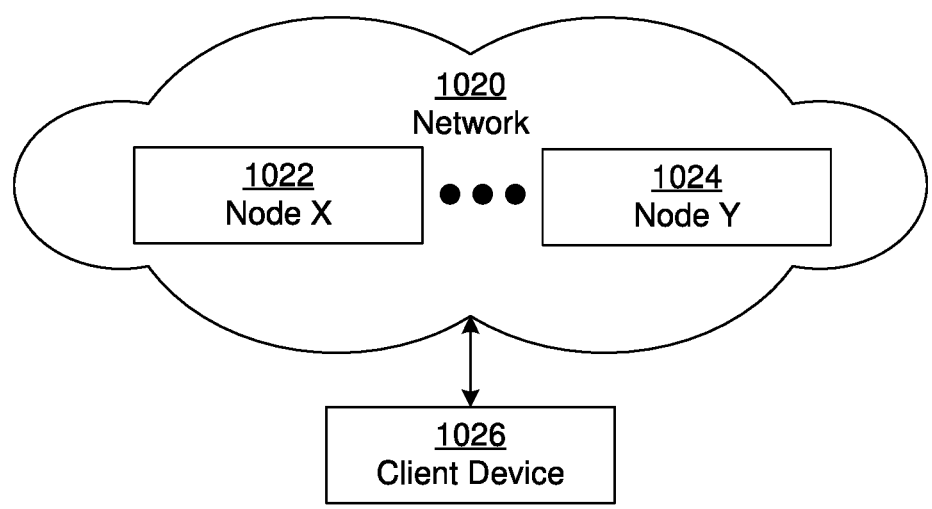
*FIG. 10.2*

METHOD AND SYSTEM FOR GENERATING A COMPLETION DESIGN USING A STREAMLINE MODEL

CROSS REFERENCE TO RELATED APPLICATIONS

The referenced application claims benefit of U.S. Patent Application Ser. No. 62/492,069 filed on Apr. 28, 2017. U.S. Patent Application Ser. No. 62/492,069 is incorporated herein by reference in its entirety.

BACKGROUND

Computer systems are used for a variety of technological fields in order to model various aspects of a technology. For example, one use of computer systems is to model underground formations and model the extraction of hydrocarbons. Specifically, sensors at the oilfield gather large volumes of data. The sensors send the large volumes of data to the computer system. Through the various techniques of mathematical modeling and simulations, the computer system attempts to create an optimal design for extracting hydrocarbons. A challenge exists to manage the amount of data that the computer system receives, the execution times, and the various timing requirements for returning a result. Often, the computer system is inefficient or inaccurate when performing the modeling and generating a result. Inefficiency causes delay or more computing resources to be used and inaccuracy causes the resulting design to be non-optimal.

SUMMARY

In general, in one aspect, one or more embodiments relate to reservoir sweep efficiency that includes obtaining fluid front arrival times for streamlines in a reservoir. A wellbore is partitioned into independent production zones, and a target flow rate is allocated to each of the independent production zones based on the fluid front arrival times. Partition choke parameters complying with the target flow rates are allocated to generate a completion design, which is presented.

Other aspects of the technology will be apparent from the following description and the appended claims.

BRIEF DESCRIPTION OF DRAWINGS

FIGS. 10.1 and 10.2 show a computing system in accordance with one or more embodiments.

DETAILED DESCRIPTION

Figure 1:
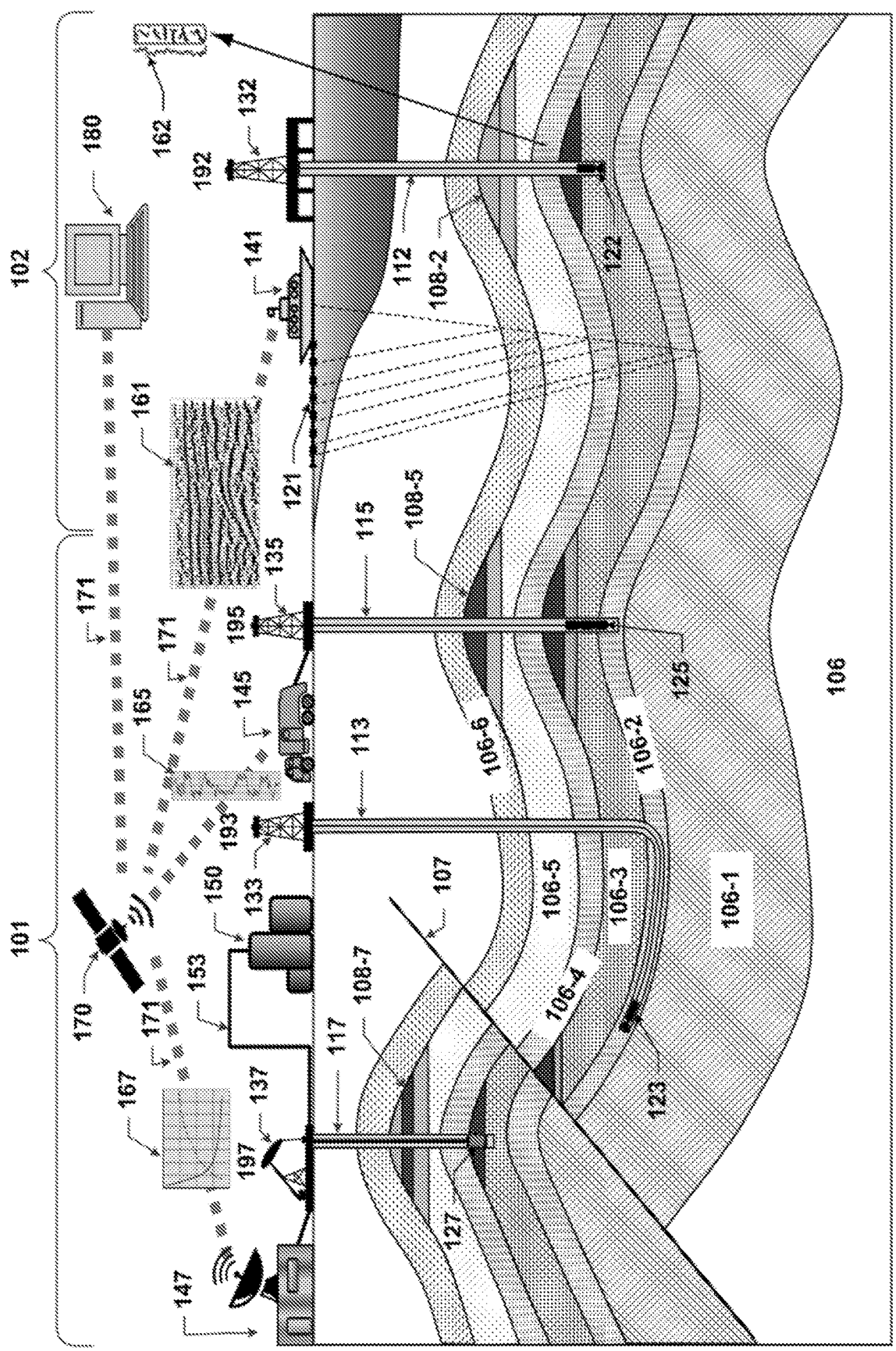
FIG. 1 depicts a schematic view, partially in cross section, of an onshore field and an offshore field in which one or more embodiments may be implemented.

Specific embodiments will now be described in detail with reference to the accompanying figures. Like elements in the various figures are denoted by like reference numerals for consistency.

In the following detailed description of embodiments, numerous specific details are set forth in order to provide a more thorough understanding. However, it will be apparent to one of ordinary skill in the art that embodiments may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to be a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments are directed to improving the accuracy and efficiency of a computer system when generating a completion design. Embodiments create an optimizer for well production and completion design via a streamline model-based equalizing of front arrival times. In one or more embodiments, a set of streamlines in a reservoir model are traced and a proxy model is used to identify front arrival times of each streamline. Streamlines terminating at the same grid cell may be grouped into a streamline bundle. The wellbore is partitioned to minimize the variance of the front arrival times of streamlines terminating within the same partition. Each partition corresponds to an independent production zone. For each independent production zone, a target rate is allocated to the independent production zone based on the front arrival times. The choke parameters are assigned to match the target rate. The process may repeat to obtain a completion design. Accordingly, a field operation may be performed based on the choking parameter. One or more embodiments improve the efficiency of the computer by using proxy models rather than full simulations to obtain the front arrival times of the individual streamlines.

FIG. 1 depicts a schematic view, partially in cross section, of an onshore field (101) and an offshore field (102) in which one or more embodiments may be implemented. In one or more embodiments, one or more of the modules and elements shown in FIG. 1 may be omitted, repeated, and/or substituted. Accordingly, embodiments should not be considered limited to the specific arrangement of modules shown in FIG. 1.

As shown in FIG. 1, the fields (101), (102) includes a geologic sedimentary basin (106), wellsite systems (192), (193), (195), (197), wellbores (112), (113), (115), (117), data acquisition tools (121), (123), (125), (127), surface units (141), (145), (147), well rigs (132), (133), (135), production equipment (137), surface storage tanks (150), production pipelines (153), and an exploration and production (E&P) computer system (180) connected to the data acquisition tools (121), (123), (125), (127), through communication links (171) managed by a communication relay (170).

The geologic sedimentary basin (106) contains subterranean formations. As shown in FIG. 1, the subterranean formations may include several geological layers (106-1 through 106-6). As shown, the formation may include a basement layer (106-1), one or more shale layers (106-2, 106-4, 106-6), a limestone layer (106-3), a sandstone layer (106-5), and any other geological layer. A fault plane (107) may extend through the formations. In particular, the geologic sedimentary basin includes rock formations and may include at least one reservoir including fluids, for example the sandstone layer (106-5). In one or more embodiments, the rock formations include at least one seal rock, for example, the shale layer (106-6), which may act as a top seal. In one or more embodiments, the rock formations may include at least one source rock, for example the shale layer (106-4), which may act as a hydrocarbon generation source. The geologic sedimentary basin (106) may further contain hydrocarbon or other fluids accumulations associated with certain features of the subsurface formations. For example, accumulations (108-2), (108-5), and (108-7) associated with structural high areas of the reservoir layer (106-5) and containing gas, oil, water or any combination of these fluids.

In one or more embodiments, data acquisition tools (121), (123), (125), and (127), are positioned at various locations along the field (101) or field (102) for collecting data from the subterranean formations of the geologic sedimentary basin (106), referred to as survey or logging operations. In particular, various data acquisition tools are adapted to measure the formation and detect the physical properties of the rocks, subsurface formations, fluids contained within the rock matrix and the geological structures of the formation. For example, data plots (161), (162), (165), and (167) are depicted along the fields (101) and (102) to demonstrate the data generated by the data acquisition tools. Specifically, the static data plot (161) is a seismic two-way response time. Static data plot (162) is core sample data measured from a core sample of any of subterranean formations (106-1 to 106-6). Static data plot (165) is a logging trace, referred to as a well log. Production decline curve or graph (167) is a dynamic data plot of the fluid flow rate over time. Other data may also be collected, such as historical data, analyst user inputs, economic information, and/or other measurement data and other parameters of interest.

The acquisition of data shown in FIG. 1 may be performed at various stages of planning a well. For example, during early exploration stages, seismic data (161) may be gathered from the surface to identify possible locations of hydrocarbons. The seismic data may be gathered using a seismic source that generates a controlled amount of seismic energy. In other words, the seismic source and corresponding sensors (121) are an example of a data acquisition tool. An example of seismic data acquisition tool is a seismic acquisition vessel (141) that generates and sends seismic waves below the surface of the earth. Sensors (121) and other equipment located at the field may include functionality to detect the resulting raw seismic signal and transmit raw seismic data to a surface unit (141). The resulting raw seismic data may include effects of seismic wave reflecting from the subterranean formations (106-1 to 106-6).

After gathering the seismic data and analyzing the seismic data, additional data acquisition tools may be employed to gather additional data. Data acquisition may be performed at various stages in the process. The data acquisition and corresponding analysis may be used to determine where and how to perform drilling, production, and completion operations to gather downhole hydrocarbons from the field. Generally, survey operations, wellbore operations and production operations are referred to as field operations of the field (101) or (102). These field operations may be performed as directed by the surface units (141), (145), (147). For example, the field operation equipment may be controlled by a field operation control signal that is sent from the surface unit.

Further as shown in FIG. 1, the fields (101) and (102) include one or more wellsite systems (192), (193), (195), and (197). A wellsite system is associated with a rig or a production equipment, a wellbore, and other wellsite equipment configured to perform wellbore operations, such as logging, drilling, fracturing, production, or other applicable operations. For example, the wellsite system (192) is associated with a rig (132), a wellbore (112), and drilling equipment to perform drilling operation (122). In one or more embodiments, a wellsite system may be connected to a production equipment. For example, the well system (197) is connected to the surface storage tank (150) through the fluids transport pipeline (153).

In one or more embodiments, the surface units (141), (145), and (147), are operatively coupled to the data acquisition tools (121), (123), (125), (127), and/or the wellsite systems (192), (193), (195), and (197). In particular, the surface unit is configured to send commands to the data acquisition tools and/or the wellsite systems and to receive data therefrom. In one or more embodiments, the surface units may be located at the wellsite system and/or remote locations. The surface units may be provided with computer facilities (e.g., an E&P computer system) for receiving, storing, processing, and/or analyzing data from the data acquisition tools, the wellsite systems, and/or other parts of the field (101) or (102). The surface unit may also be provided with, or have functionality for actuating, mechanisms of the wellsite system components. The surface unit may then send command signals to the wellsite system components in response to data received, stored, processed, and/or analyzed, for example, to control and/or optimize various field operations described above.

In one or more embodiments, the surface units (141), (145), and (147) are communicatively coupled to the E&P computer system (180) via the communication links (171). In one or more embodiments, the communication between the surface units and the E&P computer system may be managed through a communication relay (170). For example, a satellite, tower antenna or any other type of communication relay may be used to gather data from multiple surface units and transfer the data to a remote E&P computer system for further analysis. Generally, the E&P computer system is configured to analyze, model, control, optimize, or perform management tasks of the aforementioned field operations based on the data provided from the surface unit. In one or more embodiments, the E&P computer system (180) is provided with functionality for manipulating and analyzing the data, such as analyzing seismic data to determine locations of hydrocarbons in the geologic sedimentary basin (106) or performing simulation, planning, and optimization of exploration and production operations of the wellsite system. In one or more embodiments, the results generated by the E&P computer system may be displayed for user to view the results in a two-dimensional (2D) display, three-dimensional (3D) display, or other suitable displays. Although the surface units are shown as separate from the E&P computer system in FIG. 1, in other examples, the surface unit and the E&P computer system may also be combined. The E&P computer system and/or surface unit may correspond to a computing system, such as the computing system shown in FIGS. 10.1 and 10.2 and described below.

Figure 2:
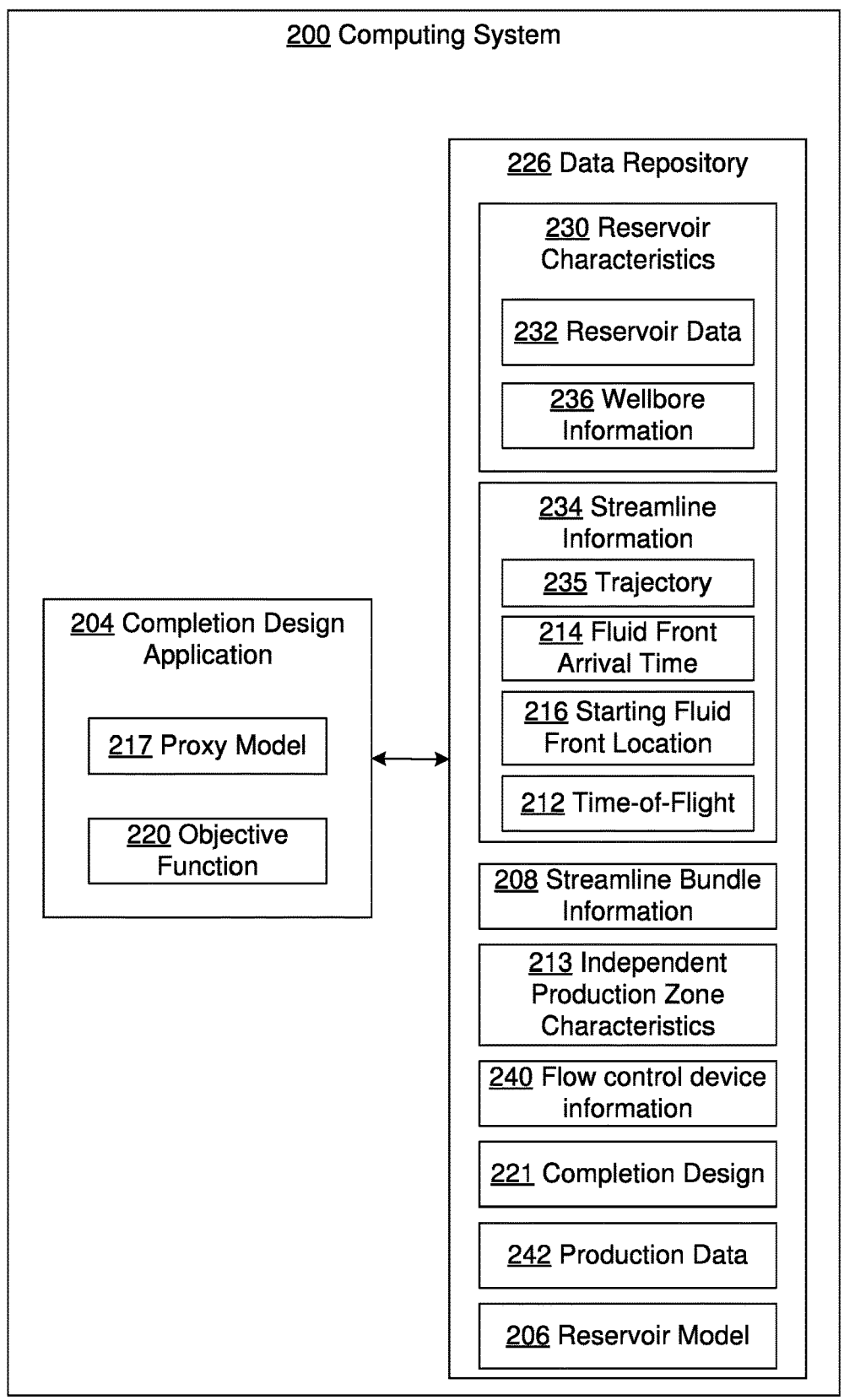
FIG. 2 shows a computer system in accordance with one or more embodiments.

FIG. 2 shows a computing system (200), which may be the same as computing system (180) in FIG. 1. The hardware components of computing system (200) is described in further detail below and in FIGS. 10.1 and 10.2. The computing system includes a completion design application (204) and a data repository (226).

In one or more embodiments of the technology, the data repository (226) is any type of storage unit and/or device (e.g., a file system, database, collection of tables, physical memory, or any other storage mechanism) for storing data. The storage of data may be permanent, semi-permanent, or temporary (e.g., during execution of the completion design application (204)). Further, the data repository (226) may include multiple different storage units and/or devices. The multiple different storage units and/or devices may or may not be of the same type or located at the same physical site.

The data repository (226) includes functionality to store reservoir characteristics (230). The reservoir characteristics (230) is information about the subsurface formations from which hydrocarbons may be produced. The reservoir characteristics (230) may further include information about the wellbore. The reservoir characteristics (230) may be input for the reservoir model (206), discussed below. Reservoir characteristics (230) includes reservoir data (232) and wellbore information (236)

Reservoir data (232) is information about the subsurface formation. For example, the reservoir data (232) may include information about the physical properties of the subsurface formations, such as porosity, permeability, gamma ray logs, etc. that is gathered from the seismic and other sensors described above with reference to FIG. 1.

Wellbore information (236) is information describing the wellbore, such as the wellbore in FIG. 1. For example, wellbore information may include information about the geometry (e.g., shape) and trajectory (e.g., path) of the wellbore. One or more embodiments may be applied to a single lateral, multi-lateral, or multi-well configuration. Wellbore information (236) may also include information about the upstream devices connected to the wellbore for completion operations.

Continuing with the data repository (226), the data repository (226) includes functionality to store streamline information. Streamline information (234) is information describing individual streamlines in the subsurface formation. A streamline is a trajectory of a particle in a velocity/flux field. Specifically, a streamline refers to a path that a particle would take through a three-dimensional space (e.g., reservoir) for a pressure solution at a given time. In the reservoir simulation, the streamline is defined as a computational flow line tangent to the reservoir model numerical velocity field. Thus, the streamlines start in various locations in the reservoir and end at the one or more wellbores. Under consistent production/injection levels, streamline geometry changes as the velocity field varies dynamically with field operations. The changes of the streamline geometry are much slower than the movement of the fluid fronts along the streamlines. A streamline geometry may also change based on the location of packers and the choke parameters along the wellbore discussed below. A streamline is not a physical property of the subsurface formation, such as a fracture, but rather is a modeled property of the subsurface formation. In particular, the three-dimensional domain of the reservoir is decomposed into many one-dimensional streamlines, and fluid flow calculations are performed along each streamline.

In one or more embodiments, streamline information (234) includes the trajectory (235), the starting fluid front location (216), fluid front arrival time (214), and the time of flight (212). The streamline information (234) may also include other information about the streamline, such as pressure. The trajectory (235) is the path of the streamline through the reservoir model (206) (described below). The starting fluid front location (216) is the starting location in the reservoir in which the streamline intersects a fluid front. A fluid front is the location in which the particles flowing along the streamline or wellbore changes from one composition to another composition. For example, the fluid front may be a water/gas front whereby the particles change from gas particles to water particles or from water particles to gas particles. In other words, the primary composition of the particles flowing changes from water to gas or from gas to water. By way of other examples, the fluid fronts may be the start of oil, water, gas, or other composition of particles.

The Fluid front arrival time (214) is the amount of time at which the fluid front travels from the starting fluid front location (216) in the reservoir to an ending location. The ending location may be the wellbore (e.g., a grid cell on the wellbore) or a location along the wellbore. The location of the fluid front moves during production as hydrocarbons are produced. The fluid front arrival time (214) is the time in which the fluid front arrives at the ending location. The fluid front arrival time (214) may be a relative time that is relative to a timestep, other streamline arrival times, or start of production operations. The fluid front arrival time (214) may be defined in any of various units (e.g., seconds/minutes/hours, timesteps, etc.) without departing from the scope of the claims.

The time of flight (212) is the travel time of a particle along a streamline. For example, the time of flight may be the outcome from streamline tracing processing (e.g., described in reference to Block 301 of FIG. 3 discussed below). By way of comparison, Fluid front arrival time (214) may be obtained by the time of flight information along streamline and the fluid front location and a conversion process via proxy model (e.g., described in reference to Block 301 in FIG. 3 discussed below).

Continuing with the data repository (226), the data repository (226) may also include functionality to store streamline bundle information (208), independent production zone characteristics (213), flow control device information (240), completion design (221), production data (242), and a reservoir model (206).

Streamline bundle information (208) is information describing each streamline bundle. A streamline bundle is a set of two or more streamlines that terminate at a same location at the wellbore. For example, the streamlines in the streamline bundle may terminate at a same grid cell along the wellbore. The streamline bundle information (208) may include, for each streamline bundle, identifiers of streamlines in the streamline bundle, include fluid front arrival time for the streamline bundle, and the terminating location of the streamline bundle. The identifiers of the streamlines are unique identifiers assigned to each streamline. The fluid front arrival time for the streamline bundle may be a single value for the fluid front arrival time that is assigned to the streamline bundle as a whole. Streamline bundle information may further include a unique identifier assigned to the streamline bundle.

By grouping streamlines into streamline bundles, the fluid front arrival times of the streamlines may be grouped into a single value. Thus, rather than the computing system performing individual simulations on each streamline, the computing system may perform on the streamline bundle as a group. By treating a streamline bundle as a single group, the computing system more efficiently uses the computing system resources.

Independent production zone characteristics (213) is information describing each independent production zone. An independent production zone is a zone spanning a section along the length of the wellbore from which hydrocarbons may be produced. For example, the independent production zone may be defined by a starting measured depth and an ending measured depth of the wellbore. The collection of independent production zones defines a partitioning of at least a portion of the wellbore, whereby each independent production zone is a partition.

In one or more embodiments, the wellbore is partitioned into independent production zones in order to minimize the variance of the fluid front arrival time between streamlines leading to the same partition. The start and end of the independent production zone may be packer locations or locations of packers in the completion design. Each independent production zone (213) has independent production zone characteristics (213). The independent production zone characteristics (213) includes information describing the independent production zone, such as the fluid front arrival time in the independent production zone, the fluid volume, the location of the independent production zone, identifiers of the streamlines and streamline bundles in the independent production zone, target flow rate for the independent production zone, other information, or any combination thereof. The target flow rate is the rate of flow for the streamline bundle.

In one or more embodiments, independent production zones are defined to maximize sweep efficiency. During completion operations, achieving uniform fluid front arrival time is optimal. Because the streamlines have varying volumes of fluid and different locations of fluid fronts, streamlines may have different fluid front arrival times. Sweep efficiency is having uniform fluid front arrival times at the production equipment, production storage tanks, and other production components located at the surface. Sweep efficiency may be an effectiveness measure of an enhanced oil recovery process that depends on the volume of the reservoir contacted by the injected fluid. Sweep efficiency may also be hydrocarbon recovery efficiency by primary depletion without injection wells or water and/or gas injection wells.

Flow control device information (240) is information describing flow control devices along the wellbore. The flow control devices may include passive inflow control devices (ICD) and active inflow control devices (e.g., flow control valves).

A completion design (221) is a specification of the configuration of physical equipment in the oilfield to extract hydrocarbons. For example, the completion design (221) may specify the packet positions, choking parameters, flow control configurations, and other aspects of the completion design. Production data (242) is information about the volume, composition, velocity, and other aspects of the hydrocarbons produced from the wellbore. In one or more embodiments, the production data (242) is dependent on the completion design.

A reservoir model (206) is a model of an oilfield reservoir. In one or more embodiments, the reservoir model (206) is defined as a grid spanning a subsurface region. The grid may be a regular grid or irregular grid. Each location in the grid is a grid cell. The size of the grid cell is the scale at which the reservoir model models the subsurface formations with the reservoir. Each grid cell has physical properties defined for the grid cell. For example, the physical properties may be porosity, permeability, composition, or other properties. The reservoir model may further include information about fluid flow through the reservoir. The physical properties may be obtained using the oilfield equipment described above with reference to FIG. 1.

Continuing with FIG. 2, a completion design application (204) is communicatively connected to the data repository (226). For example, the completion design application (204) includes functionality to read, write, and store data in the data repository (226). The completion design application (204) includes functionality to generate a completion design (221) based on a reservoir model (206). For example, the completion design application (204) may include functionality to use the reservoir characteristics and/or the reservoir model as input, identify streamlines and streamline bundles, partition the wellbore, and calculate a completion design. The completion design application (206) may include functionality to store data in the data repository (226) temporarily or at least semi permanently. For example, the data stored may be for use of the completion design application while generating the completion design (221).

In one or more embodiments, the completion design application (204) includes a proxy model (217) and an objective function (220). The proxy model (217) is a mathematical model that converts starting fluid front location (216) for a streamline into a fluid front arrival time (214). In one or more embodiments, the proxy model is calculated independently for each streamline.

The objective function (220) is a mathematical function that calculates a partitioning of the wellbore into independent production zones. Specifically, the objective function minimizes the variance between streamlines within independent production zones.

Figure 3:
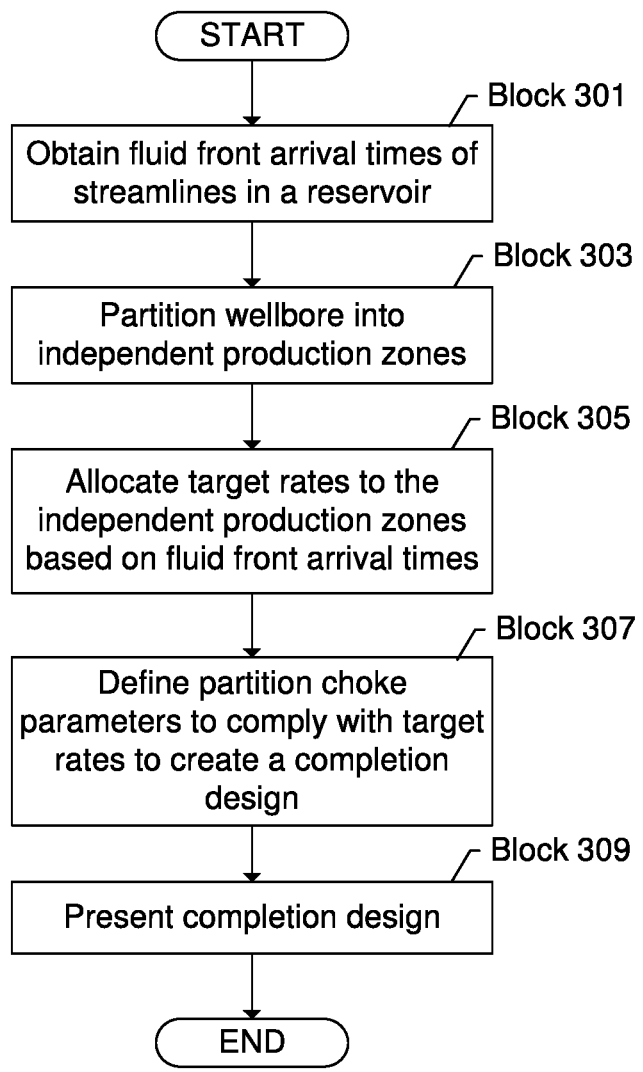
FIG. 3 shows a flowchart in accordance with one or more embodiments.

FIG. 3 shows a method flowchart in accordance with one or more embodiments. One or more blocks shown in FIG. 3 may be omitted, repeated, and/or performed in a different order among different embodiments. Accordingly, embodiments should not be considered limited to the specific number and arrangement of blocks shown in FIG. 3.

In Block 301, the fluid front arrival times of streamlines in the reservoir is obtained. In one or more embodiments, a reservoir model is obtained. The reservoir model may be generated or provided as input from another source. The reservoir model may be generated based on the reservoir characteristics and information obtained from the data acquisition tools deployed across the fields as depicted in FIG. 1 above.

Based on the reservoir model, streamlines tracing may be performed. One or more embodiments use a streamline tracing algorithm that includes handling of aquifers and sampling of reservoir properties from the underlying model grid cells of the reservoir model. The reservoir properties are sampled onto the streamlines for identifying the water and gas fronts.

Each streamline includes a profile that specifies the starting fluid front location. For each streamline, a proxy model may be individually executed for the streamline to identify a fluid front arrival time to a defined location (e.g., location along the wellbore, completion point, etc.). Because the proxy model is a set of mathematical calculations rather than simulations, the amount of time to compute the fluid front arrival time is less. Thus, the proxy model represents a full blown numerical three phase (3-phase) three-dimensional (3D) reservoir simulation in the vicinity of a horizontal wellbore. Thus, one or more embodiments efficiently use computer system resources. An example of a proxy model is discussed below in relation to Equations Eq. 1-33.

In one or more embodiments, streamlines may be grouped into streamline bundles according to termination location. The grouping of streamlines may be performed subsequent to streamline tracing for a streamline group. In one or more embodiments, streamlines that terminate into a same grid cell of the reservoir model are grouped into a single streamline bundle having a single fluid front arrival time. The fluid front arrival time is the fluid front arrival time at the grid cell. The grid cell may be a specific grid cell along the wellbore in the reservoir model. In one or more embodiments, the single fluid front arrival time associated with a streamline bundle may be an average, median or other value calculated from the fluid front arrival times of individual streamlines in the streamline bundle.

Figure 8:
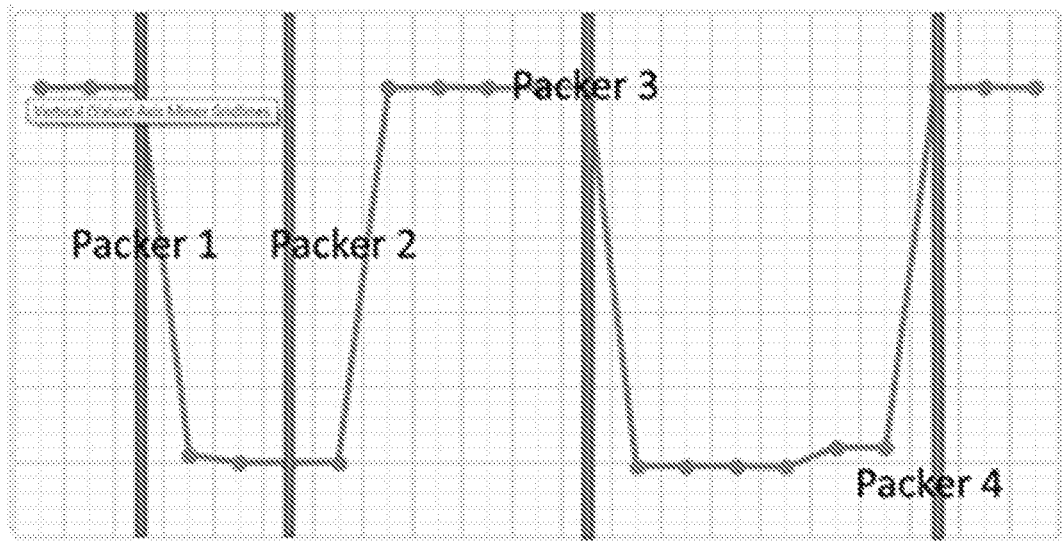
FIG. 8 shows an example in accordance with one or more embodiments.
Figure 9:
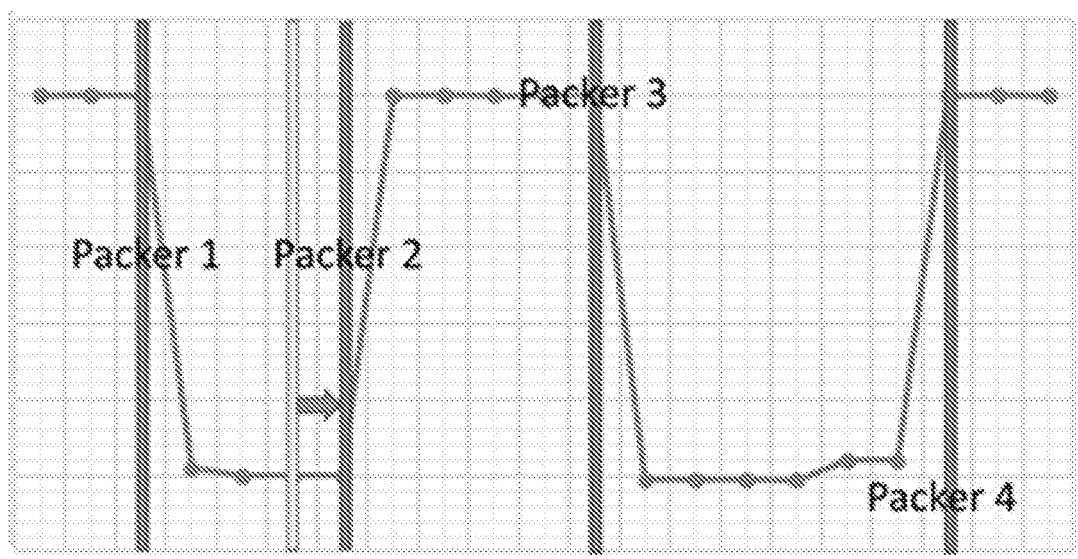
FIG. 9 shows an example in accordance with one or more embodiments.

In Block 303, the wellbore is partitioned into independent production zones in accordance with one or more embodiments of the invention. In one or more embodiments, the partitioning is performed to minimize the variance between profiles of streamlines. The partitioning of the wellbore may be based on any measured depth-based log. In other words, the partitioning is performed based on a log that has values varying along the measured depth of the wellbore. For example, the partitioning may be performed based on the fluid front arrival times of the streamlines and streamline bundles (e.g., arrival time log), a permeability log, a gamma ray log, other information, or any combination thereof. In one or more embodiments, the partitioning is based on a maximum number of packers. In one or more embodiments, the partitioning uses a minimization optimization function to minimize the variance. Specifically, the objective function may be to minimize the sum of the variances within each independent production zone across the independent production zones. The constraints on the objective function may include that the streamlines are contiguous, the number of packers, and other limitations on the creation of the streamline bundles. Partitioning the wellbore may be performed using the packer placement algorithm described below and in reference to FIGS. 7-9.

Because streamlines trace no-flow boundaries as no flow crossing exists between streamlines by definition, any segmentation of the reservoir aligned with the streamline bundles produces a relatively stable segregation of the reservoir flux field into independently produced zones with no major cross-flow between the independently produced zones. Thus, each streamline is assigned to an independent production zone in one or more embodiments.

Continuing with FIG. 3, in Block 305, target flow rates are allocated to the independent production zones based on the fluid front arrival times. In one or more embodiments, each independent production zone is analyzed independently. Fluid front arrival times of streamlines and streamline bundles along with reservoir flow rates are used to identify leading edge and trailing edge of streamlines in the streamline production zones. In other words, streamlines having leading edge (e.g., earliest fluid front arrival times) and remaining streamlines are identified in the independent production zones.

Across the independent production zones, target flow rates are assigned in accordance with one or more embodiments. Based on the leading edge, trailing edge, and reservoir flow rates, target rates are assigned to independent production zones to equalize fluid front arrival times across the independent production zones. In other words, the objective is to obtain a uniform fluid front arrival time that is uniform among the production zones. Creating the uniform fluid front arrival time maximizes sweep efficiency. Thus, the target flow rates are assigned to obtain uniformity and maximize sweep efficiency. In one or more embodiments, a target flow rate is assigned to each independent production zone. In one or more embodiments, assigning target flow rates may be performed as discussed below with reference to equations, Eq. 39-49.

Accordingly, one or more embodiments provide an efficient fluid front arrival time evaluation from the speed of fractional flow front that is derived on top of the time-of-flight (TOF). The fluid front arrival time evaluation estimates when the fluids will breakthrough at the well completion without running a full simulation. The fluid front arrival time evaluation gives computational time savings in the workflow. One or more embodiments utilize an allocation procedure of the leading edge and the trailing edge breakthrough rates for each of the intervals that generates reliable interval rate targets based on the actual distribution of individual streamline rates.

In Block 307, partition choke parameters are defined to comply with target rates. In one or more embodiments, the choke parameters specify the settings for the flow control devices along the wellbore. Multiple flow control devices may be located within an independent production zone where each flow control device has a separate setting. The settings of the flow control devices are defined to achieve the target rates for the independent production zones. The settings for a flow control device may account for flow from downstream flow control devices to the flow control device. In addition to settings, the locations of the flow control devices may be defined to achieve the target rates. As another example, one or more of the locations may be predefined. Accordingly, an optimal configuration or parameter setting of a passive inflow control device (ICD) and/or an active inflow control device (flow control valve) (e.g., improved nozzle sizing) is determined for a more uniform breakthrough time across production zones.

In one or more embodiments, the packer positions as defined by the partitions along with the partition choke parameters form a completion design. Blocks 301-307 may be repeated for the completion design. In particular, the existence of the packers and the chokes may change the fluid front arrival times and the locations of the streamlines. To accommodate the changes in fluid front arrival times and the locations of the streamlines, the flow may return to Block 301 to perform streamline tracing using the revised reservoir model with the completion design from the previous iteration. Blocks 301-307 may be repeated until convergence is achieved. Convergence exists when the streamline information from a preceding iteration matches the streamlines for a subsequent iteration. Match may be substantially similar streamline information. Convergence may be determined to be achieved based on an equalization coefficient satisfying a criterion, where the criteria defines a degree of matching. In one or more embodiments, an optimal completion design is a completion design that converges and has a sweep efficiency matching a criterion for sweep efficiency. An optimal solution may satisfy additional criteria such as minimum flow rate, etc.

Continuing with FIG. 3, in Block 309, the completion design is presented. The completion design that is presented may include packer positions, choking parameters, zone production rates, etc. The completion design may be presented to another application, such as using an application programming interface, placed in storage, using a graphical user interface, or via another presentation technique. In one or more embodiments, the production configuration is presented to a user via a user interface in the surface unit depicted in FIG. 1 above. In one or more embodiments, production presented by sending to a software and/or hardware component of the exploration and production (E&P) computer system or wellsite systems depicted in FIG. 1 above.

A field operation may be performed in response to presenting the packer position and choking parameter. In one or more embodiments, the field operation is performed as described in reference to FIG. 1 above.

In one or more embodiments, the information obtained from the aforementioned data acquisition tools may include real time information during the field operation. Accordingly, the reservoir model may be adjusted based on the real time information. The method flow chart may be performed in response to adjusting the reservoir model based on the real time information during the field operation. One or more embodiments reduce the computing time and computing resources used in performing the method flow chart so as to eliminate or otherwise minimize delay of the field operation.

As shown above, one or more embodiments provide proactive optimization using forward modeling by advancing flow control valve settings to mitigate unwanted fluid (e.g., water, gas) production and maximize oil and or gas production. For example, the flow control valve settings are optimized such that water and gas moving fronts, from an aquifer or gas cap, arrive at the wellbore within a narrow time range to reduce the time span of water or gas production. In particular, a semi-analytical solution is employed in the reservoir domain that may not use a single full simulation run for the gas/water front tracking during the optimization process. the semi-analytical solution produces savings in computational resources and computing time. Further, proactively determining how the fluids can be controlled improves reservoir recovery and efficiency with less intervention efforts.

More specifically, one or more embodiments utilize a fast analytical approach for breakthrough time estimation along a horizontal wellbore under generic multiphase flow conditions. Water and gas fronts' arrival time estimation is performed without running full reservoir simulation but rather running streamline simulation from time to time to output fluid front arrival times. Cycling through packer placement (wellbore segmentation) and flow control valves (e.g., ICD/AICD/ICV) sizing allows coupling of the reservoir and the well optimization in order to maximize sweep.

Figure 4:
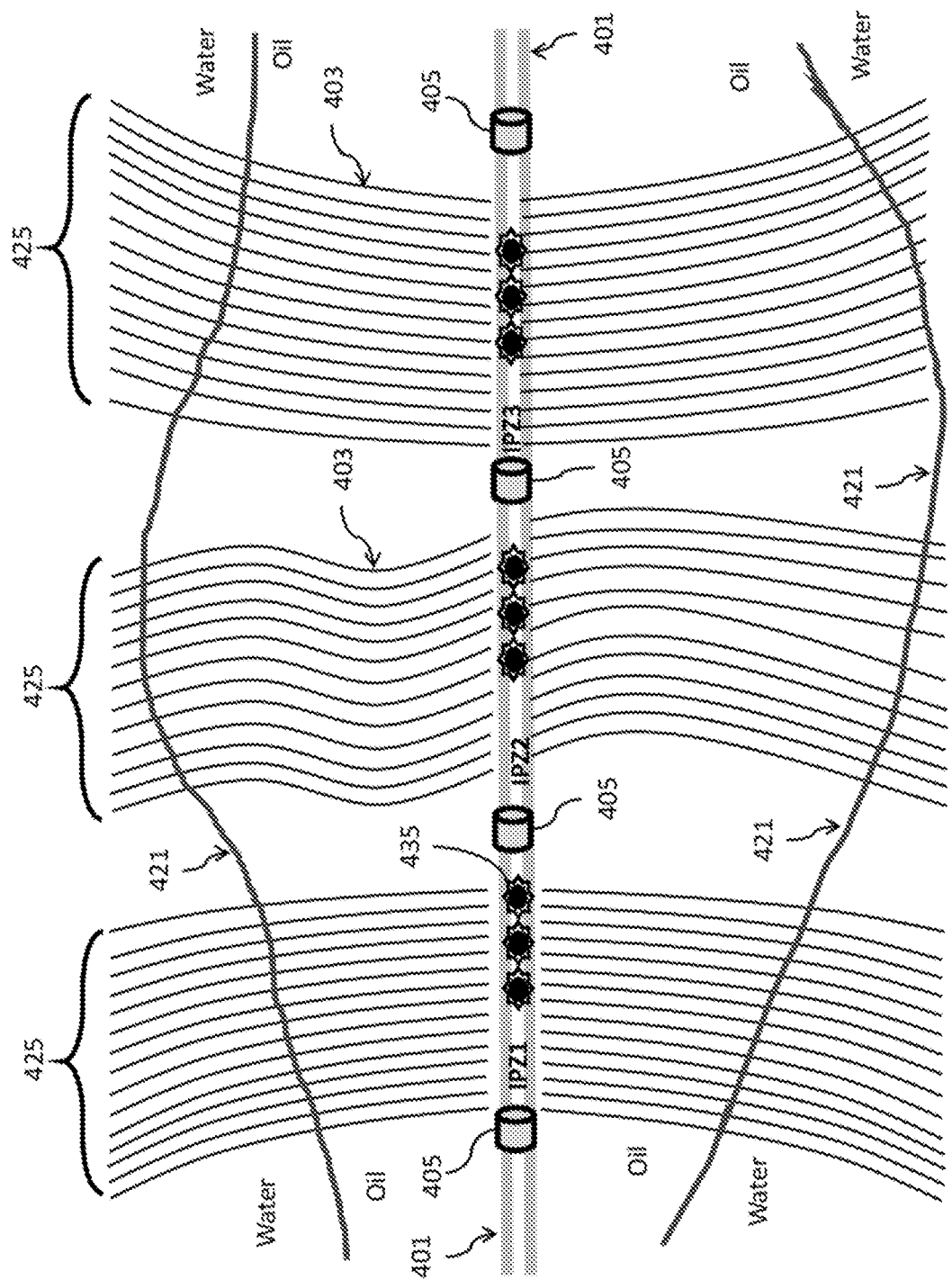
FIG. 4 shows an example in accordance with one or more embodiments.

FIG. 4 shows a map view of a horizontal wellbore (401) with streamlines (403) making up streamline bundles (425) with corresponding multiple independent production zones IPZ1, IPZ2 and IPZ3. In particular, the streamline bundles (425) are associated with different production zones located between packers. The production zones are between packers (405) placed along the wellbore (401). Production zones may have perforations and flow control devices (435) to adjust so that the fluid front, moving during production, arrives at all the production zones at the same time. The time-of-flight is the initial time between the fluid front (421) and the wellbore (production zone). In other words, the time-of-flight is the time it would take fluids to change over, or water to breakout, from oil to water (or from water to gas) without any changes to any characteristics of the corresponding independent production zone (e.g. optimization of packer position, choker size, controlled production rate, etc.). The streamline sections extending outside of the fluid front (421) (away from the wellbore (401)) represent water saturated areas, while streamline sections between the fluid front (421) and the horizontal wellbore represent oil filled areas.

The wellbore (401) may be a single lateral well, multi-lateral well, or combination of multiple lateral well(s) and multi-lateral well(s). The packer 405 position and choking parameter (435) may belong to a set of packer positions and choking parameters of the wellbore. In one or more embodiments, the choking parameter is associated with a passive inflow control device (ICD) or an active inflow control device (flow control valve) of the wellbore.

Figure 5:
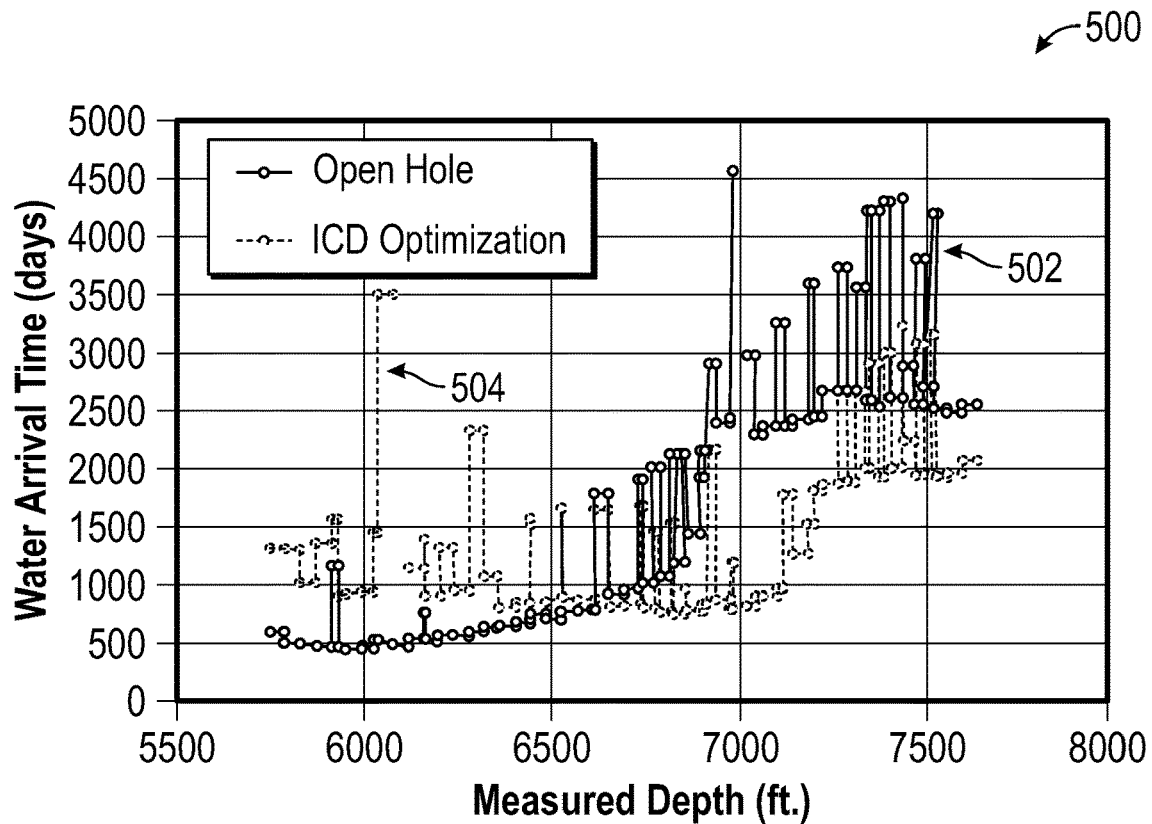
FIG. 5 shows an example in accordance with one or more embodiments.

One or more embodiments provide streamline-based ICD nozzle size optimization with interval rate reallocation. Using the streamline derived breakthrough time estimation and the associated rate information as well as the wellbore annulus compartmentalization by packers and near-wellbore flow geometry, new target rates are obtained for each well completion interval that maximize the sweep efficiency. FIG. 5 shows one optimization case example (500) that compares open hole (502) and the optimized ICD completion design (504) in terms of the water arrival time along the horizontal well. As shown, the optimized ICD completion design delays the water arrival time for measured depths greater than 6600 feet. By delaying the water arrival time, sweep efficiency is improved as compared to the open hole design.

Figure 6:
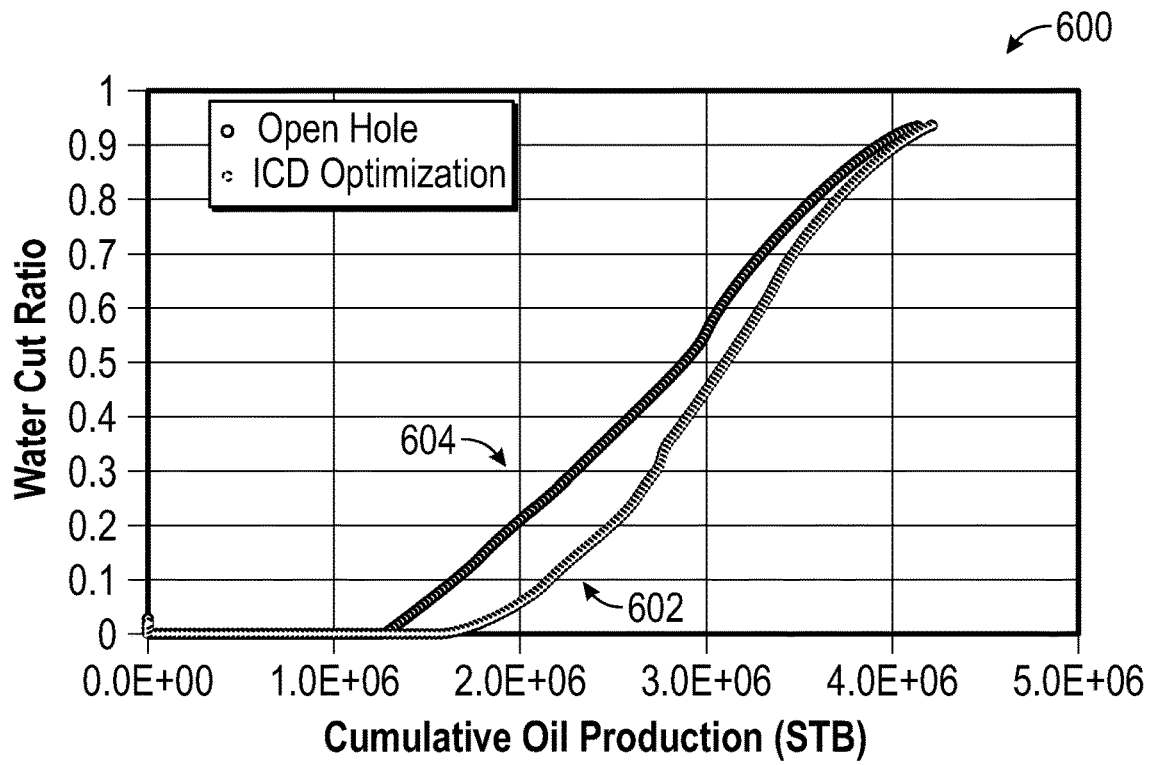
FIG. 6 shows an example in accordance with one or more embodiments.

Similarly, FIG. 6 shows field production response cross-plots (600) of water cut ratio versus cumulative oil production. In particular, the optimized ICD (602) completion design results in larger cumulative oil production while reducing water production as compared to the open hole design (604).

Additional examples include dynamic optimization of other types of flow control valves (e.g., ICV, Manara, etc.). Applied at discrete time intervals, embodiments allow re-allocating of the flow rate between various independent production zones in the same well/lateral or across different wells/laterals to account for the dynamic nature of stream-line field, which was discounted in the static ICD optimization. This feature is particularly applicable when substantial changes in well rates or reservoir drive mechanism exist in the reservoir management scenario.

The following is an example of a proxy model. In one or more embodiments, the proxy model is numerical algorithm to convert the streamline time of flight information into fluid front arrival time. The time of flight to the fluid front arrival time conversion including gravity and compressibility effects. The algorithm may use the analytical relationship of streamline TOF (time of flight) and fluid front arrival time as equation, Eq. 1.

$$t = \frac{\tau}{\frac{dF_w}{dS_w}\Big|_{S_{w_f}}} \quad \text{(Eq. 1)}$$

This relationship was based on the immiscible, incompressible and one dimensional horizontal two-phase flow (Buckley Leverette equation) as expressed as equation, Eq. 2.

$$\frac{\partial S_w}{\partial t} + \frac{\partial F_w}{\partial \tau} = 0 \quad \text{(Eq. 2)}$$

This means this algorithm uses the gravity and compressibility effects in Eq. 1 to convert time of flight (TOF) into physical fluid front arrival time for more general cases. In order to account gravity effects, the numerical algorithm may use the fractional flow formulations for oil and water two phase flow as follows. From multiphase version of Darcy's equation, the phase flow of oil and water are expressed as equations, Eq. 3 and Eq. 4.

$$\vec{u}_o = -\vec{\vec{k}} \cdot \frac{k_{ro}}{\mu_o}(\nabla p_o + \rho_o g \nabla D) \quad \text{(Eq. 3)}$$

$$\vec{u}_w = -\vec{\vec{k}} \cdot \frac{k_{rw}}{\mu_w}(\nabla p_w + \rho_w g \nabla D) \quad \text{(Eq. 4)}$$

Ignoring the capillary pressure between oil and water ($p_o = p_w = p$), and using phase mobilities as $$\lambda_o = \frac{k_{ro}}{\mu_o} \text{ and } \lambda_w = \frac{k_{rw}}{\mu_w},$$

time of flight conversion may simplify the above equations to equations, Eq. 5 and Eq. 6.

$$\vec{u}_o = -\vec{\vec{k}} \cdot \lambda_o (\nabla p + \rho_o g \nabla D) \quad \text{(Eq. 5)}$$

$$\vec{u}_w = -\vec{\vec{k}} \cdot \lambda_w (\nabla p + \rho_w g \nabla D) \quad \text{(Eq. 6)}$$

Therefore, the total velocity is calculated using equation Eq. 7.

$$\vec{u}_t = \vec{u}_o + \vec{u}_w = -\vec{\vec{k}} \cdot (\lambda_t \nabla p + \lambda_o \rho_o g \nabla D + \lambda_w \rho_w g \nabla D) \quad \text{(Eq. 7)}$$

In Eq. 12, the total mobility is defined as $\lambda_t = \lambda_o + \lambda_w$.

The water velocity can be expressed using the total velocity Eq. 7 as equations Eq. 8 or Eq. 9.

$$\vec{u}_w = \frac{\lambda_w}{\lambda_t}\left(\vec{u}_t + \vec{\vec{k}} \cdot \lambda_o \rho_o g \nabla D - \vec{\vec{k}} \cdot \lambda_o \rho_w g \nabla D\right) \quad \text{(Eq. 8)}$$

$$\vec{u}_w = F_w\left(\vec{u}_t + \vec{\vec{k}} \cdot \lambda_o (\rho_o - \rho_w) g \nabla D\right) \quad \text{(Eq. 9)}$$

In Eq. 8 and Eq. 9, $F_w$ is defined as ratio of relative phase mobilities as equation Eq. 10.

$$F_w = \frac{\lambda_w}{\lambda_t} \quad \text{(Eq. 10)}$$

Similarly, the oil phase velocity is expressed using equation Eq. 11.

$$\vec{u}_o = F_o(\vec{u}_t + \vec{\vec{k}} \cdot \lambda_w (\rho_w - \rho_o) g \nabla D) \quad \text{(Eq. 11)}$$

In Equation, Eq. 11, $F_o$ may be calculated using equation Eq. 12.

$$F_o = \frac{\lambda_o}{\lambda_t} \quad \text{(Eq. 12)}$$

Now the fractional flow of water is defined as $$f_w = \frac{q_w}{q_T} = \frac{A \cdot \vec{u}_w}{A \cdot \vec{u}_T} \quad \text{(Eq. 13)}$$

$$= \frac{A \cdot F_w\left(\vec{u}_t + \vec{\vec{k}} \cdot \lambda_o (\rho_o - \rho_w) g \nabla D\right)}{A \cdot \vec{u}_T}$$

$$= F_w\left(1 + \frac{A \cdot \vec{\vec{k}} \cdot \lambda_o (\rho_o - \rho_w) g \nabla D}{A \cdot \vec{u}_T}\right)$$

Or using the definition of gravity number, $$N_{gv} = \frac{A \cdot \vec{\vec{k}} \cdot (\rho_o - \rho_w) g \nabla D}{\mu_o A \cdot \vec{u}_T} = \frac{A \cdot \vec{\vec{k}} \cdot (\rho_o - \rho_w) g \sin\alpha}{\mu_o A \cdot \vec{u}_T} \quad \text{(Eq. 14)}$$

and $$f_w = F_w(1 + k_{ro} N_{gv}) \quad \text{(Eq. 15)}$$

Therefore, the front speed including the gravity effect is $$\left.\frac{df_w}{dS_w}\right|_{S_{wf}} = \left.\frac{dF_w}{dS_w}\right|_{S_{wf}}(1 + k_{ro} N_{gv}) + F_w \left.\frac{dk_{ro}}{dS_w}\right|_{S_{wf}} N_{gv} = \quad \text{(Eq. 16)}$$

$$\left.\frac{dF_w}{dS_w}\right|_{S_{wf}} + \left(\left.\frac{dF_w}{dS_w}\right|_{S_{wf}} k_{ro}(S_{wf}) + F_w(S_{wf}) \left.\frac{dk_{ro}}{dS_w}\right|_{S_{wf}}\right) N_{gv}$$

Notice here, the gravity number is negative since $\rho_o - \rho_w < 0$ and the gravity force slows the front speed from the one-dimensional horizontal flow speed $$\left.\frac{dF_w}{dS_w}\right|_{S_{wf}}.$$

Eq. 16 implies that if the numerical algorithm has the analytical front speed, $$\left.\frac{dF_w}{dS_w}\right|_{S_{wf}}$$

based on ratio of relative phase mobilities, $F_w$, in Eq. 10 and corresponding values for $$k_{ro}(S_{wf}), F_w(S_{wf}), \text{ and } \left.\frac{dk_{ro}}{dS_w}\right|_{S_{wf}}$$

and the gravity number $N_{gv}$ in Eq. 14 along the streamline trajectory, the numerical algorithm can estimate the front speed including the gravity effect semi-analytically under the assumption that the fluid front travels along the streamline.

However, the numerical algorithm may estimate the front speed without evaluating all the terms in Eq. 16 with some approximations as follows. The numerical algorithm can express Eq. 16 by arranging terms as $$\left.\frac{df_w}{dS_w}\right|_{S_{wf}} = \left.\frac{dF_w}{dS_w}\right|_{S_{wf}} \frac{f_w(S_{wf})}{F_w(S_{wf})} + F_w(S_{wf})\left.\frac{dk_{ro}}{dS_w}\right|_{S_{wf}} N_{gv} \quad \text{(Eq. 17)}$$

And the numerical algorithm evaluate the first term by the Welge's graphical technique for the tangential front speed in the one-dimensional horizontal flow and it can be expressed as $$\left.\frac{dF_w}{dS_w}\right|_{S_{wf}} = \frac{F_w(S_{wf})}{S_{wf}} \quad \text{(Eq. 18)}$$

Thus, by substituting Eq. 18 to Eq. 17, the numerical algorithm get the front speed including the gravity effect as $$\left.\frac{df_w}{dS_w}\right|_{S_{wf}} = \frac{f_w(S_{wf})}{S_{wf}} + F_w(S_{wf})\left.\frac{dk_{ro}}{dS_w}\right|_{S_{wf}} N_{gv} \quad \text{(Eq. 19)}$$

The above equation indicates the front speed is defined by the tangential speed for the fractional flow $f_w(S_{wf})$ in the first term, $$\frac{f_w(S_{wf})}{S_{wf}}$$

and the weighted gravity number $N_{gv}$ in the second term. The numerical algorithm can define two nodes of streamline the near the water front locations as i and j, where i is the front location done j is the behind the front location node and each node front speeds as $$\left.\frac{df_w}{dS_w}\right|_{S_{wf}(i)} = \frac{f_w(S_{wf}(i))}{S_{wf}(i)} + F_w(S_{wf}(i))\left.\frac{dk_{ro}}{dS_w}\right|_{S_{wf}(i)} N_{gv}(i) \quad \text{(Eq. 20)}$$

$$\left.\frac{df_w}{dS_w}\right|_{S_w(j)} = \frac{f_w(S_w(j))}{S_w(j)} + F_w(S_w(j))\left.\frac{dk_{ro}}{dS_w}\right|_{S_w(j)} N_{gv}(j) \quad \text{(Eq. 21)}$$

From Eq. 20, the numerical algorithm can evaluate the gravity number dependency for the second term of Eq. 19 as $$F_w(S_{wf}(i))\left.\frac{dk_{ro}}{dS_w}\right|_{S_{wf}(i)} N_{gv}(i) = \quad \text{(Eq. 22)}$$

$$\left.\frac{df_w}{dS_w}\right|_{S_{wf}(i)} - \frac{f_w(S_{wf}(i))}{S_{wf}(i)} \approx \frac{\Delta f_w}{\Delta S_w} - \frac{f_w(S_{wf}(i))}{S_{wf}(i)} =$$

$$\frac{f_w(S_{wf}(i)) - f_w(S_w(j))}{S_{wf}(i) - S_w(j)} - \frac{f_w(S_{wf}(i))}{S_{wf}(i)}$$

So, for the second term with any Gravity number ahead of water front can be estimated as the ratio of the gravity numbers $$F_w(S_{wf}(i))\left.\frac{dk_{ro}}{dS_w}\right|_{S_{wf}(i)} N_{gv}(k) = F_w(S_{wf}(i))\left.\frac{dk_{ro}}{dS_w}\right|_{S_{wf}(i)} N_{gv}(i) \times \quad \text{(Eq. 23)}$$

$$\frac{N_{gv}(k)}{N_{gv}(i)} = \left[\frac{f_w(S_{wf}(i)) - f_w(S_w(j))}{S_{wf}(i) - S_w(j)} - \frac{f_w(S_{wf}(i))}{S_{wf}(i)}\right] \times \frac{N_{gv}(k)}{N_{gv}(i)}$$

Here the gravity number ratio can be expressed as $$\frac{N_{gv}(k)}{N_{gv}(i)} = \frac{\frac{\vec{k}(k) \cdot g\sin\alpha(k)}{q_T(k)}}{\frac{\vec{k}(i) \cdot g\sin\alpha(i)}{q_T(i)}} \quad \text{(Eq. 24)}$$

where numerical algorithm need to evaluate permeability in gravity direction (Kz) for the dot product.

For the first term of Eq. 19 with the gravity term dependency can be estimated if the numerical algorithm know the tangential speed or ratio of relative phase mobilities at the water front as follows $$\left.\frac{dF_w}{dS_w}\right|_{S_{wf}} (1 + k_{ro}(S_{wf}(i))N_{gv}(i)) = \quad \text{(Eq. 25)}$$

$$\frac{f_w(S_{wf}(i))}{S_{wf}(i)} \Leftrightarrow k_{ro}(S_{wf}(i))N_{gv}(i) =$$

$$\frac{\left(\frac{f_w(S_{wf}(i))}{S_{wf}(i)} - \left.\frac{dF_w}{dS_w}\right|_{S_{wf}}\right)}{\left.\frac{dF_w}{dS_w}\right|_{S_{wf}}} = \frac{f_w(S_{wf}(i))}{F_w(S_{wf}(i))} - 1$$

Then any location k along the streamline, the first term of the speed can be estimated as $$\left.\frac{dF_w}{dS_w}\right|_{S_{wf}} (1 + k_{ro}(S_{wf}(i))N_{gv}(k)) = \quad \text{(Eq. 26)}$$

$$\left.\frac{dF_w}{dS_w}\right|_{S_{wf}} \left(1 + k_{ro}(S_{wf}(i))N_{gv}(i) \times \frac{N_{gv}(k)}{N_{gv}(i)}\right) =$$

$$\left.\frac{dF_w}{dS_w}\right|_{S_{wf}} \left(1 + \left(\frac{f_w(S_{wf}(i))}{F_w(S_{wf}(i))} - 1\right) \times \frac{N_{gv}(k)}{N_{gv}(i)}\right) =$$

$$\frac{f_w(S_{wf}(i))}{S_{wf}(i)} \left(\frac{F_w(S_{wf}(i))}{f_w(S_{wf}(i))} + \left(1 - \frac{F_w(S_{wf}(i))}{f_w(S_{wf}(i))}\right) \times \frac{N_{gv}(k)}{N_{gv}(i)}\right)$$

Using Eq. 23 and Eq. 26 the front speed including gravity effect at any location k ahead of water front i along the streamline can be estimated as $$\left.\frac{df_w}{dS_w}\right|_{S_{wf}} (k) = \frac{f_w(S_{wf}(i))}{S_{wf}(i)} \left(\frac{F_w(S_{wf}(i))}{f_w(S_{wf}(i))} + \quad \text{(Eq. 27)}\right.$$

$$\left(1 - \frac{F_w(S_{wf}(i))}{f_w(S_{wf}(i))}\right) \times \frac{N_{gv}(k)}{N_{gv}(i)} + \left[\frac{f_w(S_{wf}(i)) - f_w(S_w(j))}{S_{wf}(i) - S_w(j)} - \right.$$

$$\left.\frac{f_w(S_{wf}(i))}{S_{wf}(i)}\right] \times \frac{N_{gv}(k)}{N_{gv}(i)}$$

In summary, the numerical algorithm may have values of $f_w(S_{wf}(i))$, $S_{wf}(i)$, $F_w(S_{wf}(i))$ at the front location i and $f_w(S_{wf}(j))$, $S_{wf}(j)$ at the one node behind the front location j and gravity number ratio $$\frac{N_{gv}(k)}{N_{gv}(i)}$$

along the streamline to estimate the front speed including the gravity effect at any location k ahead of front location i.

As for the compressibility effect, the definition of TOF is defined by equation, Eq. 28.

$$\tau = \int_\Psi \frac{\phi}{\vec{u}_t} \cdot dx \quad \text{(Eq. 28)}$$

For each segment of streamline, the total velocity can be different due to compressibility effect and pore volume and TOF can be related as $$\Delta V(\tau) q_t(\tau) = A\phi\Delta x \quad \text{(Eq. 29)}$$

From the Buckley Leverette solution relating the pore volume and front speed and time, $$x_{S_{wf}} = \frac{W_i}{A\phi} \frac{df_w}{dS_w}\bigg|_{S_{wf}} = \frac{1}{A\phi} \frac{df_w}{dS_w}\bigg|_{S_{wf}} \int_0^t q_t dt \quad \text{(Eq. 30)}$$

Therefore, TOF and the front speed and time will relate as $$\Delta\tau(\tau) q_t(\tau) = \frac{df_w}{dS_w}\bigg|_{S_{wf}} q_t \Delta t \quad \text{(Eq. 31)}$$

As long as $q_t(\tau) = q_t$ (constant) along the streamline the numerical algorithm have the relationship between time and TOF as $$\Delta\tau(\tau) = \frac{df_w}{dS_w}\bigg|_{S_{wf}} \Delta t \Leftrightarrow \Delta t = \frac{\Delta\tau(\tau)}{\frac{df_w}{dS_w}\big|_{S_{wf}}} \quad \text{(Eq. 32)}$$

For the case where total velocity along the streamline is changing, the numerical algorithm may rescale the time as $$\Delta\tau(\tau)\frac{q_t(\tau)}{q_t(\tau_0)} = \frac{df_w}{dS_w}\bigg|_{S_{wf}} \Delta t \Leftrightarrow \Delta t = \frac{\Delta\tau(\tau)}{\frac{df_w}{dS_w}\big|_{S_{wf}}} \times \frac{q_t(\tau)}{q_t(\tau_o)} \quad \text{(Eq. 33)}$$

Where the numerical algorithm use the constant production rate at well $q_t(\tau_o)$ to scale the time.

The above is only an example of time of flight conversion. Other techniques may be used without departing from the scope of the claims.

The following is an example technique for partitioning the portion of the wellbore into independent production zones. In particular, the following technique describes a packer placement algorithm that splits the borehole trajectory into independent production zones. Each independent production zone is bounded by packers. At least one quality metric of the partitioning is a permeability log variance which should be as minimal as possible.

The inputs to the packer placement algorithm include the maximum number of packers, the permeability log, the caliper log and threshold, the gamma ray log and threshold, the measured distance range, proximity restriction, and packer length. The maximum number of packers is the number of packers that can be used to produce the design. The permeability log is a list of the log samples. The caliper log and respective threshold and the gamma ray log and respective threshold define no go zones. Gamma ray and caliper no go zones may be combined with logical "or"\"and" operations. The measured distance range defines horizontal segment of the trajectory. The proximity restriction specifies the minimum distance between two packers. The packer length is the length of the packer.

Figure 7:
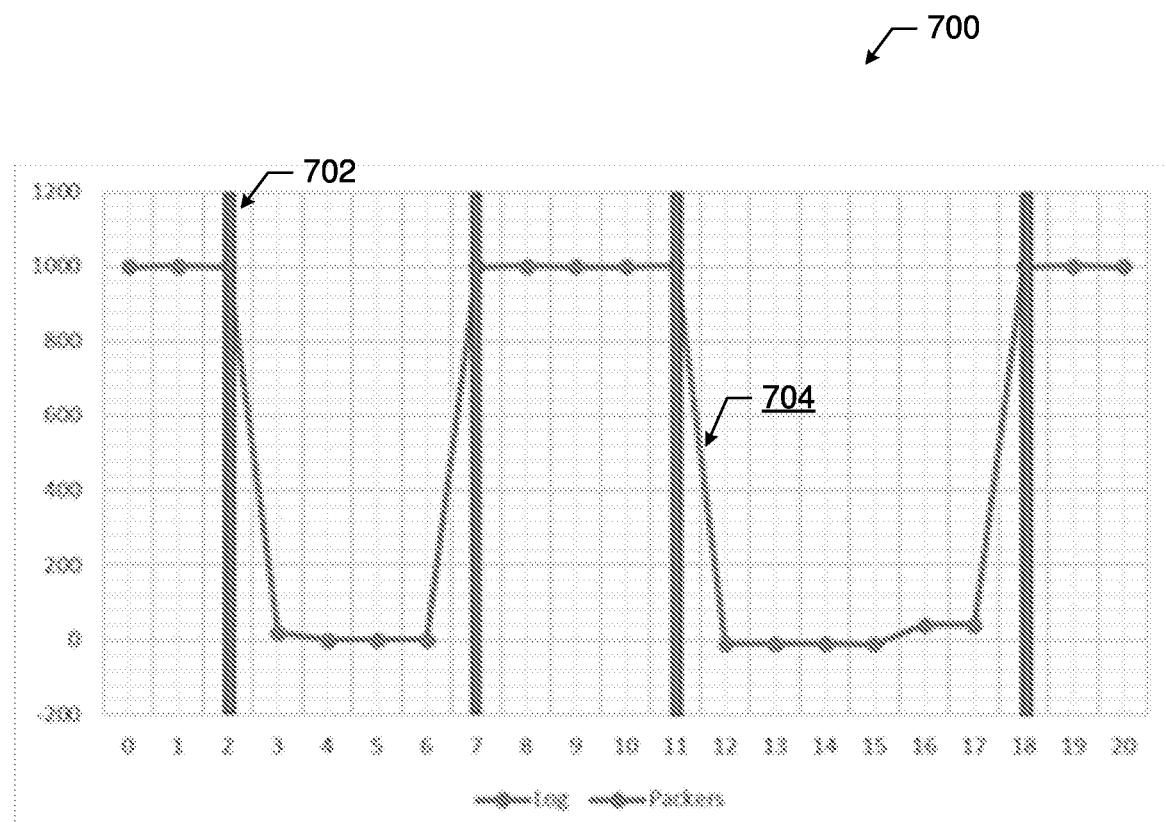
FIG. 7 shows an example in accordance with one or more embodiments.

For the packer placement algorithm, consider the scenario in which a number of packers exist and the packers are to be placed in the borehole. Based on the permeability packers should isolate a segment of the well trajectory where permeability fluctuates around one particular value. The packer placement position is performed using partitioning. An example of the partitioning that may be performed is shown in FIG. 7. Specifically, FIG. 7 shows a graph of the permeability log (704) where the x-axis is measured depth and the y-axis is permeability. The packer positions are the vertical lines (e.g., vertical line (702)).

A measurement of partitioning quality may be computed using the following equation, Eq. 34.

$$S = \Sigma_{i=1}^n \sigma_i / \sigma_{total} \quad \text{(Eq. 34)}$$

In Eq. 34, S is variance, $\sigma_i$ is standard deviation of the i-th partition, $\sigma_{total}$ is the standard deviation of the whole log. The packer placement algorithm should have partitioning which has variance as minimum as possible.

In one or more embodiments, preprocessing is performed. The preprocessing is so that the packer placement algorithm may have an ability to calculate standard deviation on the range very fast. Asymptotic computational complexity should be O(1) in order to obtain the partitions design in acceptable time. In the preprocessing, the packer placement algorithm organizes preprocessed arrays for faster variance calculation. Standard deviation may be calculated using the following equation, Eq. 35.

$$\partial = \sqrt{\frac{(x_1 - \bar{x})^2 + (x_2 - \bar{x})^2 + \ldots + (x_n - \bar{x})^2}{n}} \quad \text{(Eq. 35)}$$

$$= \sqrt{\frac{(x_1^2 - 2x_1\bar{x} + \bar{x}^2) + (x_2^2 - 2x_2\bar{x} + \bar{x}^2) + \ldots + (x_n^2 - 2x_n\bar{x} + \bar{x}^2)}{n}}$$

$$= \sqrt{\frac{n*\bar{x}^2 - 2*\bar{x}*\sum_{i=1}^n x_i + \sum_{i=1}^n x_i^2}{n}}$$

In the last part of equation Eq. 35, the following values should be calculated, sum on the range, the sum of the squares on the range, and the average on the range. The values should be calculated very fast, without going through the list of the log samples.

To calculate the sum on the range and the sum of the squares on the range, the following may be performed. Because the permeability log is immutable while the packer placement algorithm executes, a preprocessing approach may be applied for fast sum calculation. Consider the following array.

sum[0] = log[0];

sum[1] = sum[0] + log[1];

sum[2] = sum[1] + log[2];

...

sum[n] = sum[n − 1] + log[n];

Once the above array is filled, the sum on the range is calculated using equation Eq. 36 as follows.

$$\text{Sum}(left, right) = sum[right] - sum[left-1] \quad (Eq. 36)$$

The same approach may be applied for sum of the squares calculation.

To calculate the average, the approach is similar to the sum. In other words, the following array may be used.

$$avg[0] = sum[0]$$
$$avg[1] = sum[1]/2;$$
$$avg[2] = sum[2]/3;$$
$$\ldots$$
$$avg[n] = sum[n]/(n+1);$$

Once the average array is filled, the average may be calculated using equation Eq. 37 as follows.

$$\text{Avg}(left, right) = (avg[right]*(right+1) - avg[left-1]*left)/(right-left+1); \quad (Eq. 37)$$

The standard deviation may then be calculated using the following equation Eq. 38 and the output of the above.

$$\partial(l, r) = \sqrt{\frac{n*avg(l,r)^2 - 2*avg(l,r)*sum(l,r) + sqsum(l,r)}{n}} \quad (Eq. 38)$$

After preprocessing, the variance may be calculated quickly. Thus, the main portion of the algorithm may be performed. Consider that a partition with two packers from scratch exists. The first is at the start of the measured depth range and the last is at the end of the range. The two packers are only for the purpose of performing the algorithm and not in the completion design. The packer placement algorithm iteratively attempts to improve results from previous step. On each iteration, the packer placement algorithm inserts one more packer and searches for the optimal location for the newly added packer and for previously placed packers. Thus, the design with four packers and the design with five packers may be completely different. The packer placement algorithm repeats until the number of packers does not exceed the maximum number.

In the following iterative process, the packer placement performs N iterations where N is a maximum number of packers. On each iteration, the algorithm does the following steps. The first step is to search for a best initial place for a new packer. In the first step, the packer placement algorithm searches through the log samples and attempts to put the packer. If the sample is in no-go zone or another packer is already placed at the location or proximity restriction is not satisfied, then packer placement algorithm moves to the next sample. Otherwise, packer placement algorithm attempts to put the packer at the sample. The packer placement algorithm calculates new variance value, compares the new variance with minimum variance, and selects the smallest of the new variance and the minimum variance.

In the second step of the iteration, the packer placement algorithm determines whether the partitioning may be improved. If, on the first step, the packer placement algorithm has not identified any place for a packer, the optimization should be stopped. In other words, further iterations are not performed. Otherwise, the packer placement moves to step three. In Step three, the packer placement algorithm tries to move the packers.

Step three is performed iteratively from one packer to another. For example, consider the partitioning of FIG. 8. On the first iteration of shaking, the packer placement algorithm obtains "Packer 2" in FIG. 8 and attempts to find a better place for "Packer 2". The packer placement algorithm iterates through the sample points of the log between "Packer 1" and "Packer 3", the packer placement algorithm attempts to put "Packer 2" in the positions of the log (See, e.g., FIG. 9) and recalculates variance for the position. The packer placement algorithm chooses the position with the smallest variance. On the second iteration of step 3, algorithm takes "Packer 3" and attempts to move "Packer 3" from "Packer 2" to "Packer 4". The packer placement algorithm repeats Step three for each packer except first and last, which are not actually in the completion design.

After completing Step 3, for each packer, the packer placement algorithm restarts with Step one for adding a new packer. The process repeats until the maximum number of packers are placed or until the exit condition of Step two is satisfied.

The following is an example for allocating rates to individual production zones in one or more embodiments. With respect to an interval i, a group of streamlines may be sorted into the leading edge streamlines with early fluid front breakthrough time and the remaining streamlines with average rates and average time of flight values as $q'_i$, $q''_i$, $\tau'_i$, $\tau''_i$ respectively. The values, $q'_i$, $q''_i$, $\tau'_i$, $\tau''_i$, may be calculated using each streamline associated rate and time of flight using following equations Eq. 39-42.

$$q'_i = \sum_{k=1}^{N'_{st,i}} q'_{st,k} \quad (Eq. 39)$$

$$q''_i = \sum_{k=1}^{N''_{st,i}} q''_{st,k} \quad (Eq. 40)$$

$$\tau'_i = \frac{\sum_{k=1}^{N'_{st,i}} \tau'_{st,k} q'_{st,k}}{\sum_{k=1}^{N'_{st,i}} q'_{st,k}} \quad (Eq. 41)$$

$$\tau''_i = \frac{\sum_{k=1}^{N''_{st,i}} \tau''_{st,k} q''_{st,k}}{\sum_{k=1}^{N''_{st,i}} q''_{st,k}} \quad (Eq. 42)$$

In Equations, Eq. 39-42, $N'_{st}$ is the number of the leading edge streamline with early breakthrough time and $N''_{st}$ is the number of the rest of the streamline in the bundle connecting to the interval i.

If wellbore intervals are differentially choked, part of an individual interval or a whole interval could reverse the respective flow direction (crossflow). Crossflow occurs when wellbore annulus pressure exceeds reservoir pressure in a grid block right next to that particular annulus node. Onset of crossflow renders that grid cell unable to become a sink point for any streamlines. Streamlines that still enter that cell end up passing through to the neighboring grid cells. The negative flow through the connection of this grid cell to the wellbore is therefore unaccounted for by any of the streamlines and has to be inferred from the connection itself. A sum of this negative flows is then to be added to $q''_i$ at the trailing edge to correctly represent the total interval production.

A flat distribution of the leading edge streamline average time of flight across the well intervals is optimal. However, the flow regulation control point for ICD may be one point per one interval. Thus, regulating the leading edge streamline time of flight will adjust the rest of the streamline bundle in a proportional relationship as defined in equation, Eq. 43.

$$\frac{Q'_i}{q'_i} = \frac{Q''_i}{q''_i} \qquad \text{(Eq. 43)}$$

In Eq. 43, $Q'_i$ and $Q''_i$ are the new rates after regulating the flow in order to make the flat distribution of the leading edge streamline average time of flight across the well intervals. The relationship between pore volume and the rate and time of flight along a streamline trajectory may be calculated using equation, Eq. 44.

$$V(s) = \int \tau(s) q(s) ds \qquad \text{(Eq. 44)}$$

Each bundle of streamline volumes maintains before and after the regulation as $$Q'_i T'_i = q'_i \tau'_i \qquad \text{(Eq. 45)}$$

$$Q''_i T''_i = q''_i \tau''_i \qquad \text{(Eq. 46)}$$

In Eq. 45 and Eq. 46, the rate is assumed constant along the streamline and T' is the flat leading edge streamline average time of flight across the well intervals and $T''_i$ is the new average time of flight for the rest of the streamline bundle.

The total well rate $Q_T$ should be balanced before and after the flow regulation according to equation, Eq. 47.

$$Q_T = \sum_{i=1}^{N_T} (q'_i + q''_i) = \sum_{i=1}^{N_T} (Q'_i + Q''_i) \qquad \text{(Eq. 47)}$$

where $N_T$ is the total number of the intervals for the well.

From above equation (9), both sides of equations may be multiplied by the leading edge flat average streamline time of flight, T', using equation, Eq. 48.

$$T' \sum_{i=1}^{N_T} (q'_i + q''_i) = T' \sum_{i=1}^{N_T} (Q'_i + Q''_i) \Leftrightarrow T' \sum_{i=1}^{N_T} (q'_i + q''_i) = \qquad (\therefore \text{equation}(5))$$

$$\sum_{i=1}^{N_T} (T'Q'_i + T'Q''_i) \Leftrightarrow T' \sum_{i=1}^{N_T} (q'_i + q''_i) =$$

$$\sum_{i=1}^{N_T} \left( T'Q'_i + \frac{q''_i}{q'_i} T'Q'_i \right) = \sum_{i=1}^{N_T} \left( \left(1 + \frac{q''_i}{q'_i}\right) T'Q'_i \right)$$

$$\Leftrightarrow T' \sum_{i=1}^{N_T} (q'_i + q''_i) \sum_{i=1}^{N_T} \left( \left(1 + \frac{q''_i}{q'_i}\right) q'_i \tau'_i \right) = \sum_{i=1}^{N_T} ((q'_i + q''_i) \tau'_i) \qquad (\therefore \text{equation}(7))$$

$$\Leftrightarrow T' = \frac{\sum_{i=1}^{N_T} ((q'_i + q''_i) \tau'_i)}{\sum_{i=1}^{N_T} (q'_i + q''_i)} \qquad \text{(Eq. 48)}$$

Using Eq. 48, T' is simply the interval rate weighted interval average of leading edge average time of flight. And the regulated new rate for interval, $Q_i^{new}$, is obtained, using equations Eq. 43 and Eq. 44, as equation Eq. 49.

$$Q_i^{new} = \qquad \text{(Eq. 49)}$$

$$Q'_i + Q''_i = \left(1 + \frac{q''_i}{q'_i}\right) Q'_i = \frac{\left(1 + \frac{q''_i}{q'_i}\right) q'_i \tau'_i}{T'} = \frac{(q'_i + q''_i) \tau'_i}{T'} = q_i^{old} \frac{\tau'_i}{T'}$$

As shown by equation Eq. 49, the new interval rate is calculated by the current interval rate, $q_i^{old}$ with the ratio of current average time of flight of the leading edge streamlines, $\tau'_i$, to the leading edge flat average streamline time of flight, T', from equation Eq. 48.

Embodiments may be implemented on a computing system. Any combination of mobile, desktop, server, router, switch, embedded device, or other types of hardware may be used. For example, as shown in FIG. 10.1, the computing system (1000) may include one or more computer processors (1002), non-persistent storage (1004) (e.g., volatile memory, such as random access memory (RAM), cache memory), persistent storage (1006) (e.g., a hard disk, an optical drive such as a compact disk (CD) drive or digital versatile disk (DVD) drive, a flash memory, etc.), a communication interface (1012) (e.g., Bluetooth interface, infrared interface, network interface, optical interface, etc.), and numerous other elements and functionalities.

The computer processor(s) (1002) may be an integrated circuit for processing instructions. For example, the computer processor(s) may be one or more cores or micro-cores of a processor. The computing system (1000) may also include one or more input devices (1010), such as a touchscreen, keyboard, mouse, microphone, touchpad, electronic pen, or any other type of input device.

The communication interface (1012) may include an integrated circuit for connecting the computing system (1000) to a network (not shown) (e.g., a local area network (LAN), a wide area network (WAN) such as the Internet, mobile network, or any other type of network) and/or to another device, such as another computing device.

Further, the computing system (1000) may include one or more output devices (1008), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (1002), non-persistent storage (1004), and persistent storage (1006). Many different types of computing systems exist, and the aforementioned input and output device(s) may take other forms.

Software instructions in the form of computer readable program code to perform embodiments may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments.

The computing system (1000) in FIG. 10.1 may be connected to or be a part of a network. For example, as shown in FIG. 10.2, the network (1020) may include multiple nodes (e.g., node X (1022), node Y (1024)). Each node may correspond to a computing system, such as the computing system shown in FIG. 10.1, or a group of nodes combined may correspond to the computing system shown in FIG. 10.1. By way of an example, embodiments may be implemented on a node of a distributed system that is connected to other nodes. By way of another example, embodiments may be implemented on a distributed computing system having multiple nodes, where each portion may be located on a different node within the distributed computing system. Further, one or more elements of the aforementioned computing system (1000) may be located at a remote location and connected to the other elements over a network.

Although not shown in FIG. 10.2, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (1022), node Y (1024)) in the network (1020) may be configured to provide services for a client device (1026). For example, the nodes may be part of a cloud computing system. The nodes may include functionality to receive requests from the client device (1026) and transmit responses to the client device (1026). The client device (1026) may be a computing system, such as the computing system shown in FIG. 10.1. Further, the client device (1026) may include and/or perform at least a portion of one or more embodiments.

The computing system or group of computing systems described in FIGS. 10.1 and 10.2 may include functionality to perform a variety of operations disclosed herein. For example, the computing system(s) may perform communication between processes on the same or different system. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope. The processes may be part of the same or different application and may execute on the same or different computing system.

Rather than or in addition to sharing data between processes, the computing system performing one or more embodiments may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments, may extract one or more data items from the obtained data. For example, the extraction may be performed as follows by the computing system in FIG. 10.1. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 10.1, while performing one or more embodiments, may perform data comparison. Data comparison may be used to compare two or more data values (e.g., A, B). For example, one or more embodiments may determine whether A>B, A=B, A !=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments, A and B may be vectors, and comparing A with B involves comparing the first element of vector A with the first element of vector B, the second element of vector A with the second element of vector B, etc. In one or more embodiments, if A and B are strings, the binary values of the strings may be compared.

The computing system in FIG. 10.1 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 10.1 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions presents a few examples of functions performed by the computing system of FIG. 10.1 and the nodes and/or client device in FIG. 10.2. Other functions may be performed using one or more embodiments.

While one or more embodiments have been described with respect to a limited number of embodiments, those skilled in the art, having benefit of this disclosure, will appreciate that other embodiments may be devised which do not depart from the scope as disclosed herein. Accordingly, the scope should be limited by the attached claims.

What is claimed is:

1. A method for designing and configuring a completion of a wellbore that traverses a reservoir, the method comprising:
   i) determining a plurality of fluid front arrival times from streamline information related to a plurality of streamlines in a model of the reservoir, wherein each streamline of the plurality of streamlines starts a respective location in the reservoir and terminates at the wellbore, and wherein each fluid front arrival time of the plurality of fluid front arrival times represents an amount of time at which a fluid front travels from a fluid front location in the reservoir to an ending location in or along the wellbore;
   ii) partitioning the wellbore into a plurality of independent production zones based on the plurality of fluid front arrival times;
   iii) allocating a target flow rate to each of the plurality of independent production zones based on the plurality of fluid front arrival times to obtain a plurality of target flow rates;
   iv) generating a completion design representing a specification of configuration of physical equipment used to extract hydrocarbons produced from the wellbore, wherein the physical equipment includes flow control devices located in the plurality of independent production zones of the wellbore, wherein the completion design includes a plurality of choke parameters that specify settings for the flow control devices, and wherein the plurality of choke parameters are based on the plurality of target flow rates; and
   v) presenting the completion design and configuring the physical equipment used to extract hydrocarbons produced from the wellbore based on the completion design.

2. The method of claim 1, wherein the streamline information of i) identifies a trajectory of each of the plurality of streamlines derived by streamline tracing through the model of the reservoir.

3. The method of claim 1, further comprising:
   generating the plurality of fluid front arrival times by executing a proxy model for a streamline to obtain a fluid front arrival time for the streamline.

4. The method of claim 1, wherein the partitioning the wellbore if ii) involves grouping at least two streamlines of the plurality of streamlines into a streamline bundle based at least on the at least two streamlines terminating at a common location.

5. The method of claim 1, wherein the completion design of iv) includes locations for packers disposed along the wellbore, wherein the packers are arranged in pairs that demarcate the plurality of independent production zones.

6. The method of claim 1, wherein the partitioning the wellbore of ii) involves minimizing variance between fluid front arrival times leading to a common one of the plurality of independent production zones.

7. The method of claim 1, wherein the partitioning the wellbore of ii) is further based on measured log data.

8. The method of claim 1, wherein the partitioning the wellbore of ii) involves using an objective function that includes the fluid front arrival times to minimize a variance across the plurality of independent production zones.

9. The method of claim 1, further comprising:
   repeating the operations of i) to iv) to iteratively update the completion design.

10. The method of claim 1, wherein the configuring the physical equipment comprises configuring flow control device settings.

11. The method of claim 1, wherein the configuring the physical equipment comprises placing packers along the wellbore, wherein the packers are arranged in pairs that demarcate the plurality of independent production zones.

12. The method of claim 1, wherein the wellbore comprises a single lateral well, a multi-lateral well, or a combination of at least one lateral well and multi-lateral well.

13. A system for designing a completion of a wellbore that traverses a reservoir, the system comprising:
   a computer processor;
   memory; and
   instructions stored in the memory and executable by the computer processor to cause the computer processor to:
   i) determine a plurality of fluid front arrival times from streamline information related to a plurality of streamlines in a model of the reservoir, wherein each streamline of the plurality of streamlines starts a respective location in the reservoir and terminates at the wellbore, and wherein each fluid front arrival time of the plurality of fluid front arrival times represents an amount of time at which a fluid front travels from a fluid front location in the reservoir to an ending location in or along the wellbore;
   ii) partition the wellbore into a plurality of independent production zones based on the plurality of fluid front arrival times;
   iii) allocate a target flow rate to each of the plurality of independent production zones based on the plurality of fluid front arrival times to obtain a plurality of target flow rates;
   iv) generate a completion design representing a specification of configuration of physical equipment used to extract hydrocarbons produced from the wellbore, wherein the physical equipment includes flow control devices located in the plurality of independent production zones of the wellbore, wherein the completion design includes a plurality of choke parameters that specify settings for the flow control devices, and wherein the plurality of choke parameters are based on the plurality of target flow rates; and
   v) present the completion design in order to configure the physical equipment used to extract hydrocarbons produced from the wellbore based on the completion design.

14. The system of claim 13, wherein the streamline information of i) identifies a trajectory of each of the plurality of streamlines derived by streamline tracing through the model of the reservoir.

15. The system of claim 13, wherein the instructions further cause the computer processor to:
   generate the plurality of fluid front arrival times by executing a proxy model for a streamline to obtain a fluid front arrival time for the streamline.

16. The system of claim 13, wherein the partitioning the wellbore of ii) involves grouping at least two streamlines of the plurality of streamlines into a streamline bundle based at least on the at least two streamlines terminating at a common location.

17. The system of claim 13, wherein the completion design of iv) includes locations for packers disposed along the wellbore, wherein the packers are arranged in pairs that demarcate the plurality of independent production zones.

18. The system of claim 13, wherein the partitioning the wellbore of ii) involves minimizing variance between fluid front arrival times leading to a common one of the plurality of independent production zones.

19. The system of claim 13, wherein the partitioning the wellbore of ii) is further based on measured log data.

20. A computer program product comprising non-transitory computer-readable program code that, when executed by a computer processor of a computing system, cause the computing system to perform operations for designing a completion of a wellbore that traverses a reservoir, the operations comprising:
 i) determining a plurality of fluid front arrival times from streamline information related to a plurality of streamlines in a model of the reservoir, wherein each streamline of the plurality of streamlines starts a respective location in the reservoir and terminates at the wellbore, and wherein each fluid front arrival time of the plurality of fluid front arrival times represents an amount of time at which a fluid front travels from a fluid front location in the reservoir to an ending location in or along the wellbore;
 ii) partitioning the wellbore into a plurality of independent production zones based on the plurality of fluid front arrival times;
 iii) allocating a target flow rate to each of the plurality of independent production zones based on the plurality of fluid front arrival times to obtain a plurality of target flow rates;
 iv) generating a completion design representing a specification of configuration of physical equipment used to extract hydrocarbons produced from the wellbore, wherein the physical equipment includes flow control devices located in the plurality of independent production zones of the wellbore, wherein the completion design includes a plurality of choke parameters that specify settings for the flow control devices, and wherein the plurality of choke parameters are based on the plurality of target flow rates; and
 v) presenting the completion design in order to configure the physical equipment used to extract hydrocarbons produced from the wellbore based on the completion design.

21. The computer program product of claim 20, wherein the streamline information of i) identifies a trajectory of each of the plurality of streamlines derived by streamline tracing through the model of the reservoir.

22. The computer program product of claim 20, wherein the operations further comprises:
 generating the plurality of fluid front arrival times by executing a proxy model for a streamline to obtain a fluid front arrival time for the streamline.

23. The computer program product of claim 20, wherein the partitioning the wellbore of ii) involves grouping at least two streamlines of the plurality of streamlines into a streamline bundle based at least on the at least two streamlines terminating at a common location.

* * * * *